(12) United States Patent
Hedler et al.

(10) Patent No.: US 7,211,472 B2
(45) Date of Patent: May 1, 2007

(54) METHOD FOR PRODUCING A MULTICHIP MODULE AND MULTICHIP MODULE

(75) Inventors: Harry Hedler, Germering (DE); Roland Irsigler, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/952,383

(22) Filed: Sep. 29, 2004

(65) Prior Publication Data

US 2005/0077632 A1 Apr. 14, 2005

(30) Foreign Application Priority Data

Sep. 30, 2003 (DE) .............................. 103 45 391

(51) Int. Cl.
*H01L 21/00* (2006.01)

(52) U.S. Cl. .................... 438/126; 438/127; 438/110; 438/612; 257/777; 257/737; 257/E21.614

(58) Field of Classification Search ........ 438/110–112, 438/125–127, 109, FOR. 368, FOR. 426, 438/612; 257/673, 685, 686, 690, 692, 700, 257/776, 777, 737; 228/180.22

See application file for complete search history.

(56) References Cited

U.S. PATENT DOCUMENTS

| | | | |
|---|---|---|---|
| 5,783,870 A * | 7/1998 | Mostafazadeh et al. ...... 257/791 |
| 5,874,782 A | 2/1999 | Palagonia | |
| 5,986,334 A * | 11/1999 | Lee .............................. 257/667 |
| 6,172,423 B1 * | 1/2001 | Lee .............................. 257/780 |
| 6,239,496 B1 * | 5/2001 | Asada ........................ 257/777 |
| 6,426,549 B1 * | 7/2002 | Isaak .......................... 257/686 |
| 6,522,022 B2 | 2/2003 | Murayama | |
| 6,545,228 B2 * | 4/2003 | Hashimoto ................... 174/260 |
| 6,624,457 B2 * | 9/2003 | Li et al. ........................ 257/295 |

(Continued)

FOREIGN PATENT DOCUMENTS

DE 102 34 208 2/2003

(Continued)

OTHER PUBLICATIONS

Ghandhi, S. K., VLSI Fabrication Principles: Silicon and Gallium Arsenide, pp. 639-642, 1994, Wiley-Interscience Publication.*

*Primary Examiner*—George Fourson
*Assistant Examiner*—John M. Parker
(74) *Attorney, Agent, or Firm*—Morrison & Foerster LLP

(57) ABSTRACT

A method for producing a multi-chip module having application of at least one contact elevation onto a substrate, application and patterning of a rewiring device onto the substrate and the at least one contact elevation with provision of a contact device on the at least one contact elevation, application of a semiconductor chip onto the substrate with electrical contact-connection of the rewiring device; application of an encapsulating device that is not electrically conductive onto the semiconductor chip, the substrate, the rewiring device and the at least one contact elevation, the contact device on the at least one contact elevation at least touching a first surface of the encapsulating device; and repetition at least once of at least the first two steps, the first surface of the encapsulating device serving as a substrate and the correspondingly produced rewiring device making electrical contact with the contact device of the at least one contact elevation of the underlying plane.

9 Claims, 6 Drawing Sheets

U.S. PATENT DOCUMENTS

| | | | |
|---|---|---|---|
| 6,740,546 B2* | 5/2004 | Corisis et al. | 438/126 |
| 6,803,663 B2* | 10/2004 | Hashimoto | 257/777 |
| 6,956,283 B1* | 10/2005 | Peterson | 257/680 |
| 2001/0008309 A1* | 7/2001 | Iijima et al. | 257/737 |
| 2001/0019170 A1 | 9/2001 | Lin | |
| 2002/0140073 A1 | 10/2002 | Pai | |
| 2002/0149098 A1 | 10/2002 | Seyama | |
| 2002/0152610 A1 | 10/2002 | Nishiyama et al. | |
| 2003/0102547 A1* | 6/2003 | Higashi et al. | 257/686 |
| 2003/0112610 A1* | 6/2003 | Frankowsky et al. | 361/760 |

FOREIGN PATENT DOCUMENTS

| | | |
|---|---|---|
| DE | 101 53 609 | 5/2003 |
| DE | 102 02 881 | 8/2003 |
| DE | 102 09 922 | 10/2003 |

* cited by examiner

PRIOR ART

METHOD FOR PRODUCING A MULTICHIP MODULE AND MULTICHIP MODULE

CLAIM FOR PRIORITY

This application claims the benefit of priority to German Application No. 103 45 391.1, which was filed in the German language on Sep. 30, 2003, the contents of which are hereby incorporated by reference.

1. Technical Field of the Invention

The present invention relates to a method for producing a multichip module and a corresponding multichip module, and in particular, to a method for producing a multichip system in a package.

2. Background of the Invention

In order to be able to provide complete semiconductor system solutions, it is necessary to be able to integrate different functional units within a component. For such integration, it is possible on the one hand to choose an SoC approach (system on chip) or on the other hand an SiP approach (system in a package). SiP solutions afford the advantage that, within a package, separate chips can in each case be individually optimized, tested and produced cost-effectively as functional units. In contrast, in the case of an SOC, all the functional units are integrated within a singular chip. What is problematic in the case of SiP solutions is that the individual chips within the package, preferably within a chip stack, have to be electrically conductively connected together among one another. In order to provide these electrically conductive connections between individual chips within a chip stack, it is known for a number of methods to be used. FIG. 16 illustrates two known embodiments.

In the upper illustration in accordance with FIG. 16, a first chip A is mechanically connected to a second chip C lying above it via an interposer B. The chips A, C are electrically contact-connected via bonding wires D within the package E. The package E can be connected to a printed circuit board (not illustrated) for example via solder balls F.

In the lower known configuration illustrated in accordance with FIG. 16, a semiconductor chip A is electrically connected to a chip C via solder balls F'. The chip C likewise has bonding wires D for rewiring and contact-connection of solder balls F within the package E. The package E can be electrically contact-connected externally via the solder balls F. The known configurations explained in accordance with FIG. 16 have poor electrical properties on account of large parasitic effects at high frequencies. Based on the high inductance and capacitance of the bonding wire, many connecting points and a lack of impedance matching.

A wiring via rewiring substrates or interposers e.g. in the form of a folded package is additionally known. Such an arrangement gives rise to long signal paths, however, which likewise result in poor electrical properties at high frequencies. What is more, such a known arrangement is associated with high substrate costs.

A thin-film rewiring via the edge of a chip previously embedded with polymer to a through-plating location is likewise known. At the through-plating location, electrically conductive plated-through holes are generated in the embedding polymer prior to the separation of a wafer. Such through-plating locations are provided, for example, by holes or openings filled with metallizations. The complex processing associated with high costs is disadvantageous in this case.

It is known, moreover, to provide plated-through holes within a chip, for example by means of through-Si-vias. In the course of the contact-connection through the chip, vias are etched into the chip in this case (dry etching, wet etching). These contact-connections are thereupon passivated with subsequent metallization of the entire via. The via is metallized by the walls being metallized and the via subsequently being filled with a conductive material. This gives rise to the disadvantages that free areas have to be provided on the chip for through-plating, which necessitates an enlargement of the chip area. Moreover, the processing is complex and associated with high costs in this case as well.

SUMMARY OF THE INVENTION

The present invention provides a method for producing a multichip module and a corresponding multichip module by means of which electrically conductive connections are generated from a chip plane to an overlying chip plane.

In one embodiment of the present invention, there is provided a contact elevation and a rewiring device on the contact elevation, a chip subsequently being electrically connected to the rewiring device, whereupon embedding in an encapsulating device is effected. The contact elevation or the three-dimensional connecting element is preferably formed by a printed elevation made of a nonconductive material, such as silicone, polyurethane, polyimide, for example, or a conductive material, such as e.g. conductive adhesive, with fluid transitions to an underlying substrate, such as e.g. a sheet. Said substrate has the preferably metallic, patterned rewiring layer.

In another embodiment of the invention, a multiplicity of chips in a chip stack can advantageously be connected to one another in a simple and cost-effective manner. The use of cost-intensive rewiring substrates or disadvantageous bonding wires can thus be avoided. Following the production method according to the invention, a high degree of parallelism is made possible in the production process since, by way of example, 12 inch substrates or rectangular substrates or else a reel-to-reel method can be used. Complex metallization and filling of contact holes is not necessary, just as little as vertical patterning after separation of the chip stack along chip edges.

In still another embodiment of the invention, there is application of at least one contact elevation onto a substrate; application and patterning of a rewiring device onto the substrate and the at least one contact elevation with provision of a contact device on the at least one contact elevation; application of a semiconductor chip onto the substrate with electrical contact-connection of the rewiring device; application of an encapsulating device that is not electrically conductive onto the semiconductor chip, the substrate, the rewiring device and the at least one contact elevation, the contact device of the at least one contact elevation at least touching a first surface of the encapsulating device; and repetition at least once of at least the first two steps, the first surface of the encapsulating device serving as a substrate and the correspondingly produced rewiring device making electrical contact with the contact device of the at least one contact elevation of the underlying plane.

In accordance with one preferred embodiment, the at least one contact elevation is printed on or is applied in an injection-molding step or a stamping step or a metering step.

In accordance with a further preferred embodiment, a chip contact device is applied onto the rewiring device which is electrically contact-connected to the semiconductor chip.

In accordance with a further preferred embodiment, the chip contact device is electrically conductively connected to the rewiring device by soldering or adhesive bonding with conductive adhesive or diffusion soldering or compression bonding.

In accordance with a further preferred embodiment, the nonconductive encapsulating device is applied by printing or an injection-molding step or potting or spraying-on or spinning-on.

In accordance with a further preferred embodiment, after the application of the nonconductive encapsulating device, the contact device on the at least one contact elevation is cleaned, preferably in a plasma or wet etching step.

In accordance with a further preferred embodiment, besides semiconductor chips, provision is made of at least one passive component and/or a memory and/or an optical semiconductor device in the encapsulating device with electrical contact-connection to the rewiring device.

In accordance with a further preferred embodiment, the rewiring device is applied by means of a sputtering or plating process and is subsequently patterned photolithographically, preferably by means of a wet etching step.

In accordance with a further preferred embodiment, on the multichip module, above a final encapsulating device, solder balls or contact elevations or contact areas are applied as a connection device, in each case preferably in a manner connected conductively to an underlying plane via a rewiring device.

In accordance with a further preferred embodiment, a sheet is provided as the substrate.

In accordance with a further preferred embodiment, the contact elevation has a nonconductive material, preferably silicone or polyimide or polyurethane, or a conductive material, preferably conductive adhesive.

In accordance with a further preferred embodiment, the at least one contact elevation is bell-shaped and preferably has a transition with a small gradient between the substrate and the contact elevation.

In accordance with a further preferred embodiment, a chip contact device is applied onto the rewiring device, and is electrically contact-connected to the semiconductor chip and the rewiring device.

In accordance with a further preferred embodiment, the chip contact device is provided as a solder deposit or stud bump or fixed contact on the rewiring device.

In accordance with a further preferred embodiment, the encapsulating device has a polymer.

In accordance with a further preferred embodiment, at least two semiconductor chips in the multichip module face one another with their chip contacts.

In accordance with a further preferred embodiment, the rewiring device is metallic and preferably has a soldering resist layer or a passivation in predetermined regions.

BRIEF DESCRIPTION OF THE DRAWINGS

Exemplary embodiments of the invention are illustrated in the drawings and are explained in more detail in the description below.

In the figures.

In the figures, identical reference symbols designate identical or functionally identical component parts.

DETAILED DESCRIPTION OF THE INVENTION

Figure 1:
FIGS. 1 to 11 each show a diagrammatic cross-sectional view of successive steps in the production of a multichip module in accordance with an embodiment of the present invention.
Figure 2:

FIG. 1 illustrates a substrate 10, preferably a sheet, in cross section. In accordance with FIG. 2, at least one contact elevation 11 is applied thereto. The contact elevation 11 is made of a polymer, for example, which may be conductive, such as conductive adhesive, for example, or nonconductive, such as silicone, polyurethane, polyimide, for example. The application of the at least one contact elevation 11 is preferably effected in a printing operation or a metering operation or an injection-molding operation or a stamping step. The at least one contact elevation 11 is preferably bell-shaped and has a small gradient in the transition from the substrate 10 to the contact elevation 11. In this connection, a small gradient is understood to be a gradient of less than 0.5.

Figure 3:

In accordance with FIG. 3, a rewiring device 12 is applied and patterned onto the substrate 10 and the at least one contact elevation 11. In this case, the rewiring device 12 preferably has in each case a contact device 13 on a contact elevation 11. The contact device 13 on the contact elevation 11 is preferably obviated in the case of a contact elevation 11 made of a conductive material, the rewiring device 12 making electrical contact with the then conductive contact elevation 11. The rewiring device 12 is preferably sputtered on or plated electrochemically, patterned in a photolithographic process, preferably by means of a wet etching technique, and has a passivation or a soldering resist layer over predetermined sections (not illustrated).

Figure 4:
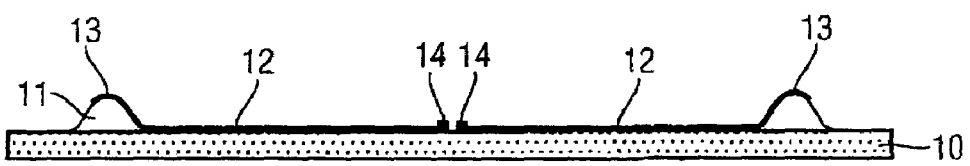

In accordance with FIG. 4, a chip contact device 14 is thereupon applied, which is electrically conductively connected to the rewiring device 12. The cross sections in accordance with FIG. 3 to FIG. 11 in each case illustrate two strands of a rewiring device 12 that are electrically isolated from one another, i.e. an electrically conductive connection in the form of the rewiring device 12 is not provided between the chip contact devices 14 in accordance with FIG. 4 ff. The chip contact device 14 is preferably provided by applying a solder deposit or a conductive adhesive deposit or a stud bump.

Figure 5:
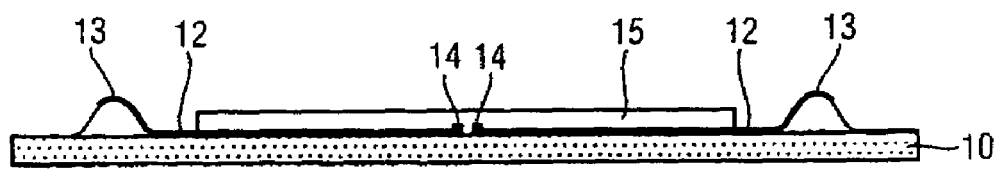

In FIG. 5, a semiconductor chip 15 is applied, preferably adhesively bonded, onto the arrangement in accordance with FIG. 4, the chip contact device 14 being electrically conductively connected to chip contacts (not illustrated) of the semiconductor device 15. This presupposes a precise positioning of the semiconductor chip 15 on the substrate 10. The electrical contact-connection of the chip contacts (not illustrated) to the chip contact device 14 is preferably effected by means of a solder reflow or a pressure contact or by diffusion soldering or an adhesive bonding connection using a conductive adhesive.

Figure 6:
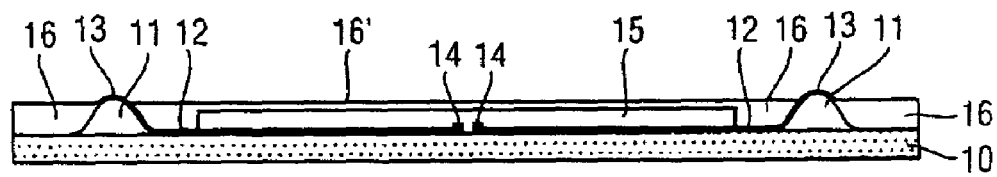

In accordance with FIG. 6, an encapsulating device 16 is applied above the chip 15, the rewiring device 12, the at least one contact elevation and the substrate 10 in the form of a nonconductive polymer. The encapsulating device 16 is preferably applied by printing on or injection molding or spraying on or spinning on of a nonconductive material. In this case, the vertical extent of the encapsulating device 16 does not exceed the vertical extent of the at least one contact elevation 11, so that the contact device 13 on the contact elevation 11 or the contact elevation 11 itself touches at least one surface 16' (covering area) of the encapsulating device 16. Preferably, the vertical extent of a contact elevation 11 projects above the vertical extent of the encapsulating device 16. In the case of the arrangement in accordance with FIG. 6, this is preferably followed by cleaning of the tips of the contact elevation 11 and in particular of the contact device 13 on the tips of the contact elevation 11, preferably in a plasma or wet etching step.

Figure 7:
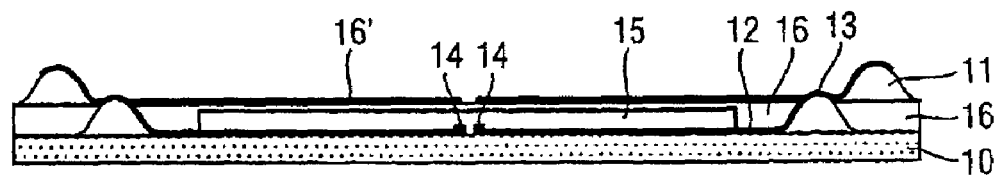

FIG. 7 shows the arrangement in accordance with FIG. 6 after contact elevations 11 have been applied onto the surface 16' of the encapsulating device 16. The contact elevations 11 on the surface 16' are arranged laterally adjacent to the uncovered contact devices 13 of the contact elevations 11 of the underlying plane. The contact elevations 11 on the surface 16' are applied in the manner explained with reference to FIG. 2. This is followed by application and patterning of a rewiring device 12 onto the surface 16' of the encapsulating device 16 and the contact elevations 11 on the surface 16' with the formation of contact devices 13 in accordance with FIG. 8. The rewiring device 12 is applied and patterned like the one explained with reference to FIG. 3. Contrary to the sectional illustration in accordance with FIG. 8, a conductor track of the rewiring device 12 on the surface 16' that is led onto a contact elevation 11 on the surface 16' and forms a contact device 13 on the tip is preferably not contact-connected to the contact device 13 on the contact elevation 11 of the underlying plane, but rather rewired with a laterally adjacent conductor track (not illustrated in the sectional illustration).

Figure 8:
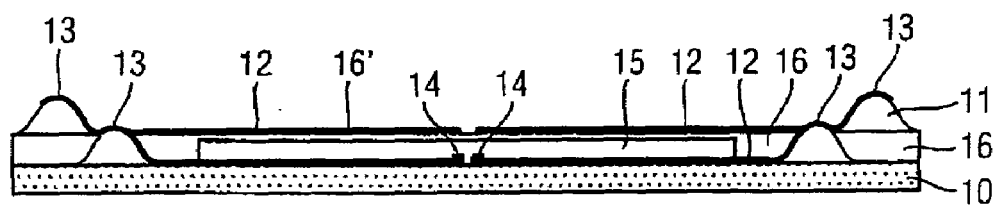
Figure 9:
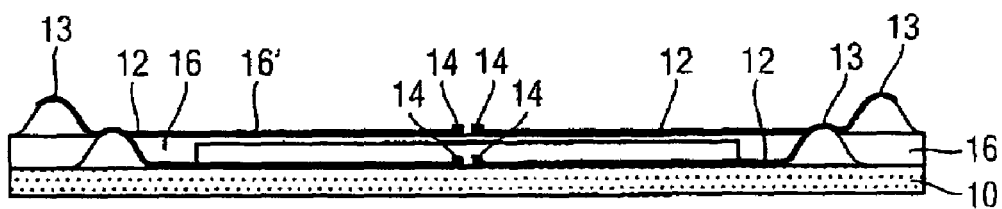

In accordance with FIG. 9, a chip contact device 14 is applied onto the arrangement in accordance with FIG. 8, which is preferably identical to the chip contact device 14 of the underlying plane.

Figure 10:
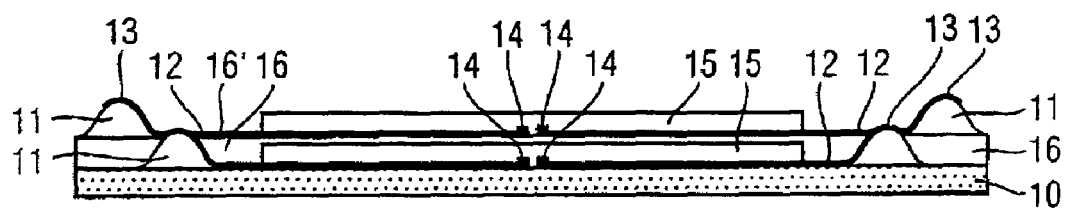

FIG. 10 illustrates the arrangement according to FIG. 9, a second semiconductor chip 15 being applied onto the surface 16' with contact-connection of the rewiring device 12, preferably via the chip contact device 14. The orientation and fixing of the second semiconductor chip 15 on the surface 16' correspond to the operation described with reference to FIG. 5.

Figure 11:
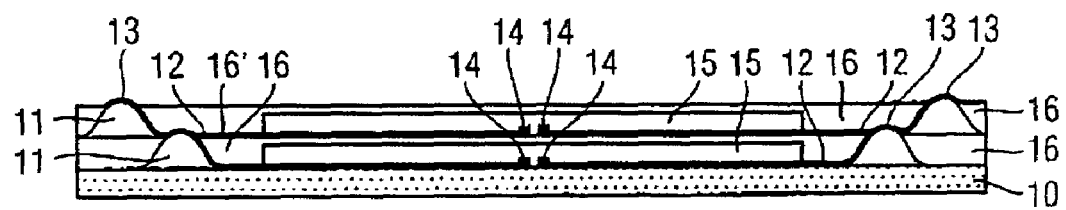

In accordance with FIG. 11, an encapsulating device 16 in accordance with FIG. 6 is likewise applied above the second semiconductor chip 15, the rewiring device 12, the contact elevation 11 in each case on the surface 16'.

Figure 12:
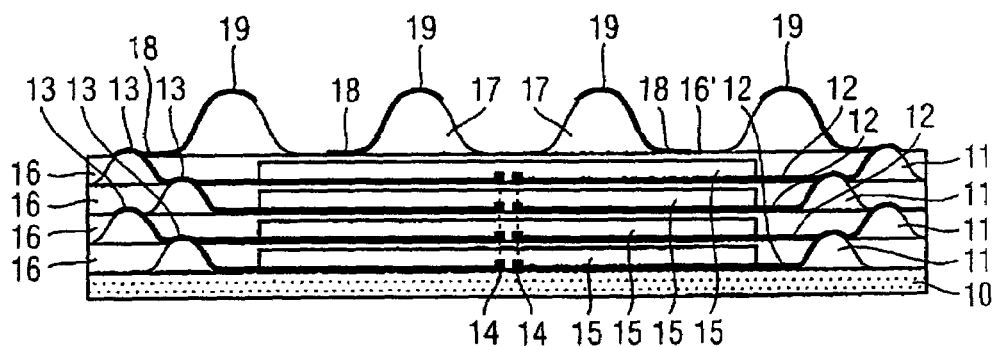
FIGS. 12 to 14 each show a diagrammatic cross section of a multichip module in accordance with a respective embodiment of the present invention.

FIG. 12 illustrates a cross section of a multichip module which, in comparison with FIG. 11, has two further semiconductor chips 15 in two further overlying planes. A multiplicity of contact elevations 17 are applied onto a final surface 16' of a final encapsulating device 16. These connecting elements for contact-connection, for example to a printed circuit board or an interposer (not illustrated in either case), are preferably likewise provided in the form of a polymer elevation comprising a conductive or nonconductive material, as described with reference to FIG. 2. A rewiring device 18 is likewise provided on the surface 16' of the topmost encapsulating device 16, which rewiring device preferably also forms contact devices 19 on the tip of the contact elevations 17. The rewiring device 18 is electrically conductively connected to contact devices 13 on the contact elevations 11 of the underlying plane.

Figure 13:
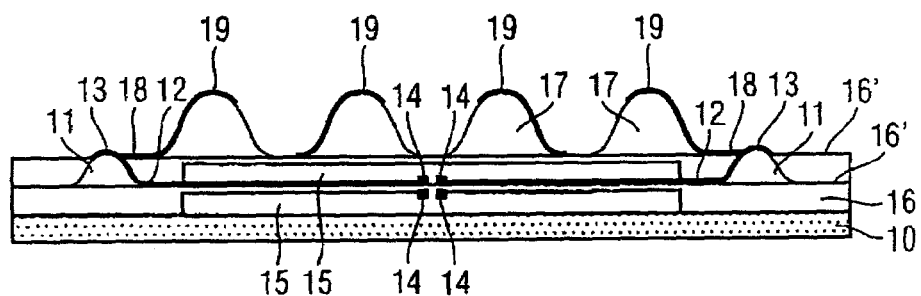

FIG. 13 shows an alternative embodiment of the present invention, in which two semiconductor chips 15 with chip contacts (not illustrated) that face one another are provided, which are in each case electrically conductively connected to a chip contact device 14. Contrary to the impression of the drawing in accordance with FIG. 13, the chip contact devices of the upper semiconductor chip 15 and of the lower semiconductor chip 15 are not directly electrically conductively connected to one another. This requires a modified production process.

Figure 14:
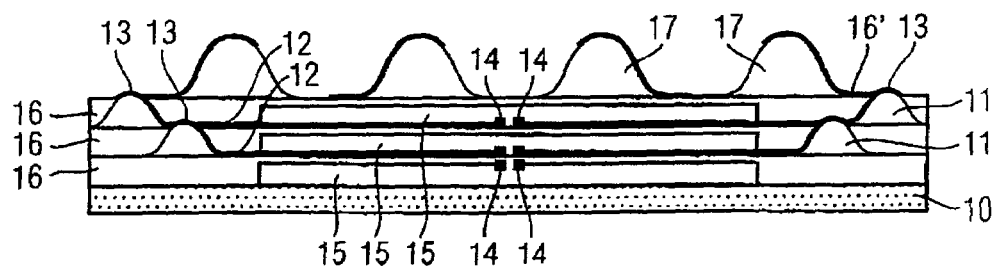

A further embodiment in accordance with FIG. 14 has the chips that face one another in accordance with FIG. 13 and a further semiconductor chip 15 arranged thereabove. All further essential features correspond to the above explanations.

Figure 15:
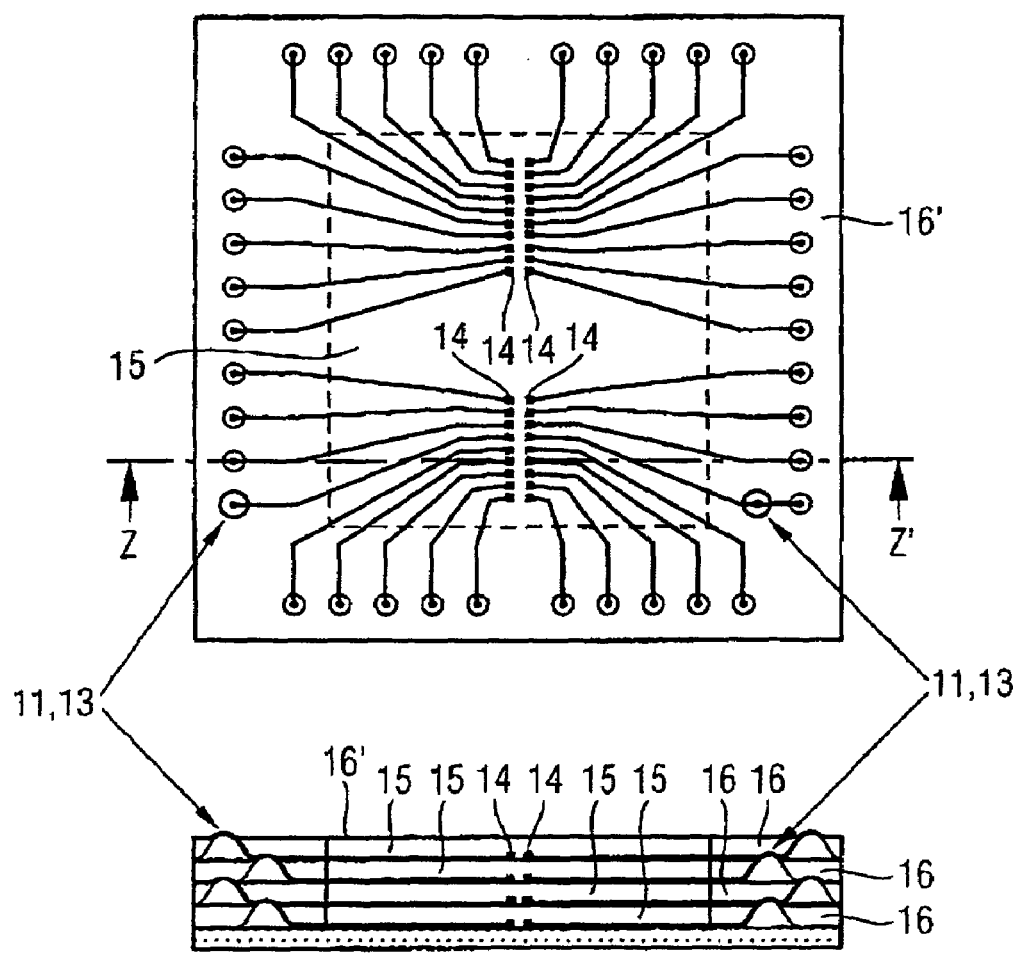
FIG. 15 shows a diagrammatic plan view and a diagrammatic cross section of a multichip module for elucidating an embodiment of the present invention.
Figure 16:
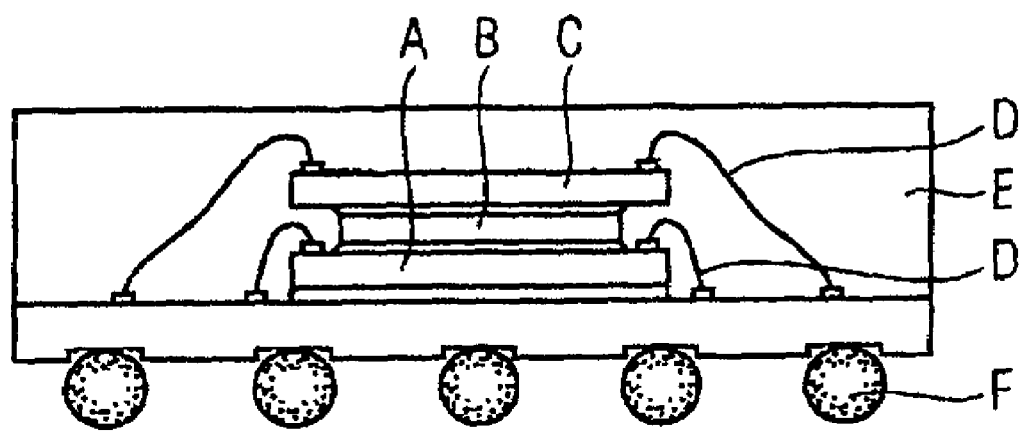
FIG. 16 shows two known multichip modules.
Figure 16:
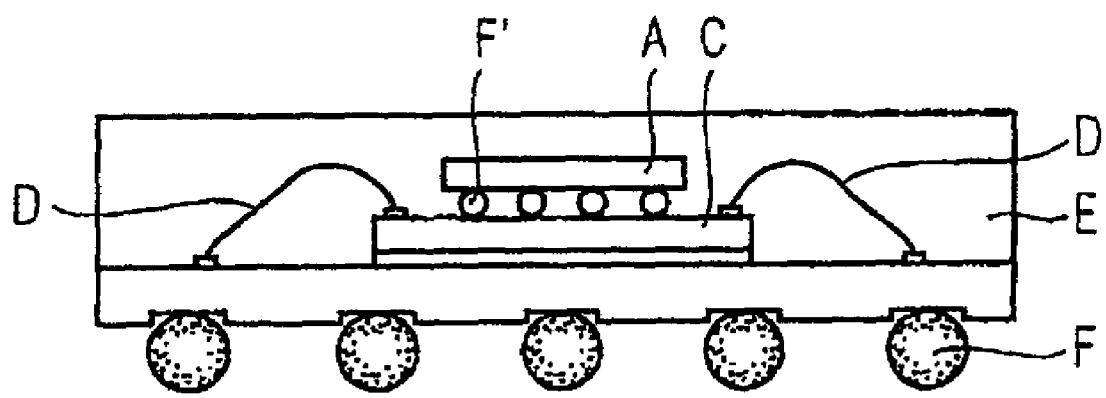

A cross section and an associated plan view for elucidating an embodiment of the present invention are illustrated diagrammatically with reference to FIG. 15. In this case, the sectional illustration corresponds to a section along the broken line ZZ'.

Although the present invention has been described above on the basis of preferred exemplary embodiments, it is not restricted thereto, but rather can be modified in diverse ways. Thus, in particular, other forms of the contact elevation produced are conceivable, for example as a bump, bead or with regard to the lateral and vertical extent. Moreover, the way of producing the contact elevation, in addition to the possibilities mentioned, is also possible by application, in particular adhesive bonding, of a preformed elevation.

In addition, it is possible to provide, instead of the contact elevations 17 with contact devices 19 on the tip thereof, other contact elements for the electrical connection to further electrical or electronic components, such as, for example, contact areas or else solder balls that are contact-connected via a rewiring device 18. Any desired configurations are possible with regard to the stack height and fashioning of the chips or the chip arrangement, so that, by way of example, different chip sizes or else chips are provided next to one another within a plane in a multichip module according to the invention. Furthermore, relative sizes reproduced in the drawings are to be regarded as merely by way of example.

What is claimed is:

1. A method for producing a multi-chip module, comprising:
    applying at least one first contact elevation on a substrate;
    applying and patterning a first rewiring on the substrate and the at least one first contact elevation with provision of a first contact device on the at least first one contact elevation;
    applying a first semiconductor chip on the substrate, the first semiconductor chip electrically contacting the first rewiring applied on the substrate;
    applying a first electrically non-conductive encapsulating layer on the first semiconductor chip and the substrate, the first encapsulating layer encapsulating the first semiconductor chip, the substrate, the first rewiring and the at least one first contact elevation so that the at least one first contact elevation protrudes through the first encapsulating layer;
    applying at least one second contact elevation with provision of a second contact device on a surface of the first encapsulating layer;
    applying and patterning a second rewiring on the surface of the first encapsulating layer; the second rewiring electrically contacting the first contact device;
    applying a second semiconductor chip on the first encapsulating layer, the second semiconductor chip electrically contacting the second rewiring applied on the first encapsulating layer; and
    applying a second electrically non-conductive encapsulating layer on the second semiconductor chip and the first encapsulating layer, the second encapsulating layer encapsulating the second semiconductor chip, the first encapsulating layer, the second rewiring and the at least one contact elevation so that the at least one second contact elevation protrudes the second encapsulating layer.

2. The method according to claim 1, wherein the at least one contact elevation is printed on or is applied in an injection-molding step or a stamping step or a metering step.

3. The method according to claim 1, wherein between applying and patterning and applying a semiconductor chip, a chip contact device is applied onto the rewiring device which is contact-connected to the semiconductor chip.

4. The method according to claim 3, wherein the chip contact device is conductively connected to the rewiring device by soldering or adhesive bonding with conductive adhesive or diffusion soldering or compression bonding.

5. The method according to claim 1, wherein the nonconductive encapsulating device is applied by printing or an injection-molding step or potting or spraying-on or spinning-on.

6. The method according to claim 1, wherein, after the application of the nonconductive encapsulating device, the contact device on the at least one contact elevation is cleaned in a plasma or wet etching step.

7. The method according to claim 1, wherein in addition to semiconductor chips, provision is made of at least one passive component and/or a memory and/or an optical semiconductor device in the encapsulating device with electrical contact-connection to the rewiring device.

8. The method according to claim 1, wherein the rewiring device is applied by means of a sputtering or plating process and is subsequently patterned photolithographically.

9. The method according to claim 1, wherein on the multi-chip module, above a final encapsulating device, solder balls or contact elevations or contact areas are applied as a connection device, in each case in a manner connected conductively to an underlying plane via a rewiring device.

* * * * *